US009859497B2

(12) United States Patent
Salcedo Reyes et al.

(10) Patent No.: US 9,859,497 B2
(45) Date of Patent: Jan. 2, 2018

(54) METHOD FOR MANUFACTURING A THIN FILM CONSISTING OF A COLLOIDAL CRYSTAL INFILTRATED WITH THE LUMINESCENT MDMO-PPV POLYMER MADE OF SILICA (SIO₂) SPHERES, HAVING A FACE-CENTERED CUBIC SYSTEM (FCC)

(71) Applicant: PONTIFICIA UNIVERSIDAD JAVERIANA, Bogotá (CO)

(72) Inventors: Juan Carlos Salcedo Reyes, Bogotá (CO); Henry Alberto Méndez Pinzón, Bogotá (CO); Luis Camilo Jiménez Borrego, Bogotá (CO)

(73) Assignee: PONTIFICIA UNIVERSIDAD JAVERIANA, Bogotá, D.C. (CO)

( * ) Notice: Subject to any disclaimer, the term of this patent is extended or adjusted under 35 U.S.C. 154(b) by 0 days.

(21) Appl. No.: 15/117,313

(22) PCT Filed: Feb. 6, 2015

(86) PCT No.: PCT/IB2015/000120
§ 371 (c)(1),
(2) Date: Aug. 8, 2016

(87) PCT Pub. No.: WO2015/118402
PCT Pub. Date: Aug. 13, 2015

(65) Prior Publication Data
US 2016/0343948 A1 Nov. 24, 2016

(30) Foreign Application Priority Data
Feb. 7, 2014 (CO) .................................. 14025971

(51) Int. Cl.
*H01L 21/00* (2006.01)
*H01L 51/00* (2006.01)
(Continued)

(52) U.S. Cl.
CPC .......... *H01L 51/0035* (2013.01); *C01B 33/18* (2013.01); *C08K 3/36* (2013.01);
(Continued)

(58) Field of Classification Search
CPC ............. H01L 51/0035; H01L 51/0003; H01L 51/0036; H01L 51/0037; H01L 51/502;
(Continued)

(56) References Cited

U.S. PATENT DOCUMENTS 6,403,238 B1    6/2002  Hörhold et al.
8,329,505 B2   12/2012  Tzolov et al.
(Continued)

FOREIGN PATENT DOCUMENTS

CN    101000949 A    7/2007
CN    101409331 A    4/2009
(Continued)

OTHER PUBLICATIONS

Castañeda-Uribe et al., "Fabrication and Optical Characterization of a Highly-Quality fcc-Opal-Based Photonic Crystal Grown by the Vertical Convective Self-Assembly Method," Universitas Scientiarum, vol. 15, No. 2, 2010, pp. 150-158.
(Continued)

Primary Examiner — Alonzo Chambliss
(74) Attorney, Agent, or Firm — Birch, Stewart, Kolasch & Birch, LLP

(57) ABSTRACT he present invention relates to a method for manufacturing thin films consisting of SiO₂ spheres of 250 nm in diameter, packed in a simple cubic structure and infiltrated with the organic luminescent polymer Poly[2-methoxy-5-(3',7'-dimethyloctyloxy)-1,4-phenylene-vinylene] (MDMO-PPV). The thin film can be deposited onto a substrate of soda lime or indium oxide doped with tin (ITO). The manufacturing method includes the synthesis of a colloidal solution with
(Continued)

the correct proportions of SiO$_2$ spheres and a high-viscosity organic solvent and the subsequent treatment thereof by spin coating. The provided method makes it possible to obtain films having a controllable thickness and a good structural quality that can easily be attached as an active region in an organic light-emitting diode where, due to the film described herein, the emission of light produced by the active region is considerably improved.

10 Claims, 9 Drawing Sheets

(51) Int. Cl.

| | |
|---|---|
| H01L 51/52 | (2006.01) |
| C01B 33/18 | (2006.01) |
| C08K 3/36 | (2006.01) |
| C08K 7/18 | (2006.01) |
| C09K 11/06 | (2006.01) |
| H01L 51/50 | (2006.01) |

(52) U.S. Cl.
CPC ............... *C08K 7/18* (2013.01); *C09K 11/06* (2013.01); *H01L 51/0003* (2013.01); *H01L 51/0036* (2013.01); *H01L 51/0037* (2013.01); *H01L 51/502* (2013.01); *H01L 51/5024* (2013.01); *H01L 51/5268* (2013.01); *H01L 51/5275* (2013.01); *C08K 2201/003* (2013.01); *C08K 2201/011* (2013.01); *C09K 2211/1425* (2013.01); *H01L 51/5004* (2013.01); *H01L 51/5012* (2013.01); *H01L 51/5056* (2013.01); *H01L 2251/552* (2013.01)

(58) Field of Classification Search
CPC ............. H01L 51/5024; H01L 51/5268; H01L 51/5275; C01B 33/18; C08K 3/36; C08K 7/18; C09K 11/06
See application file for complete search history.

(56) References Cited

U.S. PATENT DOCUMENTS

| | | | |
|---|---|---|---|
| 9,447,927 B2* | 9/2016 | Mahler | B82Y 30/00 |
| 2003/0057417 A1 | 3/2003 | Lee et al. | |
| 2005/0116625 A1 | 6/2005 | Park et al. | |
| 2006/0147169 A1 | 7/2006 | Sugita et al. | |
| 2008/0284320 A1 | 11/2008 | Karkkainen | |
| 2009/0128022 A1 | 5/2009 | Shim et al. | |
| 2010/0148158 A1 | 6/2010 | Kim et al. | |
| 2011/0132440 A1* | 6/2011 | Sivarajan | B82Y 10/00 136/252 |
| 2012/0129322 A1 | 5/2012 | Meissner et al. | |
| 2015/0034911 A1* | 2/2015 | Liu | H01L 31/053 257/40 |

FOREIGN PATENT DOCUMENTS

| | | | |
|---|---|---|---|
| CO | 6470853 | A2 | 6/2012 |
| GB | 2400235 | A | 10/2004 |
| JP | 4533041 | B2 | 8/2010 |
| KR | 2003-0026450 | A | 4/2003 |
| KR | 10-0873517 | B1 | 12/2008 |
| WO | WO 2006/110926 | A2 | 10/2006 |
| WO | WO 2007/041116 | A1 | 4/2007 |
| WO | WO 2007/141364 | A1 | 12/2007 |

OTHER PUBLICATIONS

Fujita et al., "Optical and Electrical Characteristics of Organic Light-Emitting Diodes with Two-Dimensional Photonic Crystals in Organic/Electrode Layers," Japanese Journal of Applied Physics, vol. 44, No. 6A, 2005 (first published Jun. 10, 2005). pp. 3669-3677 (10 pages total).

Hsu et al., "Fabrication of Photonic Crystal Structures on Flexible Organic Light-Emitting Diodes Using Nanoimprint," Microelectronic Engineering, vol. 91, Mar. 2012, pp. 178-184.

International Search Report (Form PCT/ISA/210) for International Application No. PCT/IB2015/000120, dated Jun. 23, 2015.

Kim et al., "Enhanced Performance of Organic Light-Emitting Diodes Using Two-Dimensional Zinc Sulfide Photonic Crystals," Journal of Applied Physics, vol. 106, Issue 11, 2016 (published online Dec. 2009), pp. 1-4.

Liu et al., "Fabrication of ZnO and its Enhancement of Charge Injection and Transport in Hybrid Organic/Inorganic Light Emitting Devices," Applied Surface Science, vol. 253, 2007 (published online Mar. 27, 2007), pp. 7506-7509.

Liu et al., "Hybrid Solar Cells from MDMO-PPV and Silicon Nanocrystals," Nanoscale, vol. 4, 2012, pp. 3963-3968.

Méndez et al., "Fabrication and Electrical Characterization of Organic Light Emitting Diodes (OLEDs)," Revista Colombiana de Fisica, vol. 41, No. 2, Apr. 2009, pp. 1-5.

Méndez-Pinzón et al., "Analysis of the Current-Voltage Characteristics of Polymer-Based Organic Light-Emitting Diodes (OLEDs) Deposited by Spin Coating," Universitas Scientiarum, vol. 15, No. 1, 2010, pp. 68-76.

Puzzo et al., "Organic Light-Emitting Diode Microcavities from Transparent Conducting Metal Oxide Photonic Crystals," Nano Letters, vol. 11, No. 4, 2011 (published online Mar. 21, 2011). pp. 1457-1462.

Saxena et al., "A Review on the Light Extraction Techniques in Organic Electroluminescent Devices," Optical Materials, vol. 32, 2009 (published online Aug. 27, 2009), pp. 221-233 (14 pages total).

Tunc et al., "Silica Nanoparticles for Enhanced Carrier Transport in Polymer-Based Short Channel Transistors," The Journal of Physical Chemistry C, vol. 117, 2013 (first published Oct. 1, 2013), pp. 22613-22618.

Wang et al., "A Nano-Patterned Organic Light-Emitting Diode with High Extraction Efficiency," Journal of Crystal Growth, vol. 288, No. 1, Feb. 2, 2006, pp. 119-122.

\* cited by examiner

Fig. 1 (State of the Art)

METHOD FOR MANUFACTURING A THIN FILM CONSISTING OF A COLLOIDAL CRYSTAL INFILTRATED WITH THE LUMINESCENT MDMO-PPV POLYMER MADE OF SILICA (SIO$_2$) SPHERES, HAVING A FACE-CENTERED CUBIC SYSTEM (FCC)

OBJECT OF THE INVENTION

The present patent application invention relates to a method of fast, simple and reproducible manufacture of a colloidal crystal with face-centered cubic packing (fcc) consisting of silica spheres (SiO$_2$) with 250 nm diameter and infiltrated with the luminescent polymer Poly[2-methoxy-5-(3',7'-dimethyloctyloxi)-1,4-phenylene-vinylene] (MDMO-PPV) using spin-coating technique.

FIELD OF THE INVENTION

The present invention is applicable within the lighting industry and, more specifically, the industry dedicated to the manufacture of luminescent flat screens, lamps, organic lasers, signs, luminous indicators and the like.

BACKGROUND OF THE INVENTION

Organic Light Emitting Diodes (OLEDs) are based on inclusion, between the anode and cathode, of an electroluminescent layer formed by a film of semiconductors and luminescent organic compounds that react to a particular electrical stimulation, thus obtaining a device that transforms electrical energy into light energy. Despite its relatively recent creation, OLED technology has developed rapidly due to its potential applications in the manufacture of flat screens, signs, and solid-state lighting elements, among others.

The basic structure of an OLED consists of one or more layers of organic semiconductor material lying between two electrodes (active region). The negative electrode (cathode) is formed by a metal or a metal alloy. The positive electrode (anode) is an optically transparent conductive material (usually glass coated with a transparent conductive oxide such as, for example, tin oxide doped with Indium), so that the light generated in the active region can pass through the anode. The active region in an OLED is typically formed by a layer of a luminescent organic molecule and an organic hole transport layer (HTL). Generally speaking, when a potential difference is applied to the device, the cathode injects electrons to the organic molecule, while the anode extracts electrons, i.e., injects positive charges (holes) in the molecule. In the organic molecule the electron-hole pair corresponding to an excited state can interact to form an exciton, which can decay radiatively generating a photon of energy equal to the difference between the HOMO (High Occupied Molecular Orbital) levels and LUMO (Low Unoccupied Molecular Orbital) of the molecule. In this way, the so-called exciton radiation of the molecule is generated. By Einstein-Planck relation the energy of each photon corresponds to the wavelength (color) of the emitted radiation.

Specifically, an MDMO-PPV/OLED (manufactured from the luminescent polymer MDMO-PPV) has the structure ITO/PEDOT:PSS/MDMO-PPV/METAL shown in FIG. 1. A thin layer of tin oxide doped with Indium (ITO) is used as the anode (A) which is a p-type degenerated semiconductor highly transparent in the visible range that, within the structure of the OLED, operates as a contact hole injector supplying positive charges to luminescent polymer (B) based on the difference between the maximum of the valence band (VBM) of the ITO and the energy of the highest occupied molecular orbital (HOMO) of the luminescent polymer, and the emission of excitons is produced by the organic MDMO-PPV layer. In order to increase the probability of hole injection into the MDMO-PPV layer, a transparent, organic and conductive layer (D) is introduced, made of poly(3,4-ethylenedioxythiophene)-poly(styrene sulfonate), abbreviated as PEDOT:PSS, which facilitates transportation of holes from the ITO to the luminescent polymer (B), because it has an intermediate level of energy between the ITO valence band and the polymer HOMO. Hence the PEDOT:PSS acts within the structure as the HTL. Different metals may be used as a cathode (C) that inject electrons to the electroluminescent layer to radiatively recombine with the holes injected from the ITO (anode). The efficiency of electron injection is strongly influenced by the work function of the metal used as the cathode, which is usually silver or aluminum [Mendez, et al., Rev. Col. Fis., 2010, 42, 397-401].

Moreover, within the field of organic electronics, improving the quantum efficiency of OLED emissions is a goal that currently exhibits great scientific activity, because the many potential technological applications (flat screens, lamps, televisions, organic lasers, etc.) of OLEDs depend fundamentally on the ability to develop methodologies that increase this external quantum efficiency. However, there is a great inherent loss in the radiation emitted by the active element in the OLED (MDMO-PPV) design, due to re-absorption of radiation by the device's constituent materials and also to having little control in directing light within the different layers and in particular the interfaces.

The radiation emitted by the active region (MDMO-PPV), can be classified into three main modes (FIG. 1): The waveguide mode, wherein the radiation is trapped in the region formed by the layers of METAL/MDMO-PPV/PEDOT:PSS/ITO due mainly to internal total reflection phenomena in the ITO/substrate and METAL/MDMO-PPV interface. The substrate mode, when the radiation is trapped within the substrate by the ITO/substrate and substrate/air interfaces. The air mode, when the radiation emitted by the active region exits the device into the air. From the viewpoint of classical optics, because of refraction-reflection processes between the different layers constituting the PPV-OLEDs, the device's light extraction efficiency is approximately only 20%, taking into account that the extraction efficiency of OLED light is defined as the ratio of the intensity of radiation in the air mode and the intensity of the total radiation emitted by the active element in the device [F. Masayuki et al., Japanese Journal of Applied Physics. 2005: 44, 3669-3677]. Thus, a number of techniques have been proposed recently that aim to solve the problem of radiation re-absorption in OLEDs. One of the simplest methods to extract some waveguide modes from the substrate is the use of a roughened surface by applying sandblasting on one side of the glass substrate and manufacturing the OLED on the other side. Due to the roughness of guided wave mode substrate in the glass-air boundary, these are coupled outside in the air gap, and the coupling efficiency increases with the roughness of the substrate. Moreover, the extraction of light from OLED using photonic crystals (PhC) arranged in different ways within the OLED structure has been proposed. [K. Saxena et al., Optical Materials, 2009, 32, 221-233]

Thus, the patent application WO2007141364 discloses a process for preparing thin films of colloidal crystal comprising the steps of: a) preparing a colloidal suspension containing the compound particles to deposit as a thin sheet of colloidal crystal, by dispersing said particles in a volatilizable liquid medium during the spin deposition process (spin-coating) and stirring said suspension for a period between 5 minutes and 24 hours, b) applying the colloidal suspension obtained in the previous step on a substrate, previously treated or not, in sufficient quantity to cover said substrate, c) rotating the substrate (spin-coating) with the compound applied in the previous stage at speeds between 1 and 200 revolutions per second for a period between 1 second and 1200 seconds.

Various patent documents illustrate techniques for the development of OLED devices, for example, Patent No. WO2006110926 refers to an OLED device using a polymer emissive layer (MEH-PPV) located between two semitransparent electrodes, where at least one electrode is perforated and the organic semiconductor polymer is a soluble derivative Poly[p-phenylene-vinylene] (PPV).

U.S. Patent document No. U.S. Pat. No. 6,403,238 discloses a process for manufacturing an OLED comprising one or more light-emitting active layers, located between two coated injector contact layers on a substrate, where at least one of the active layers consists of Poly[2-methoxy-5-(2-ethyl-hexyloxy)-1,4-phenylene-vinylene-1,2-ethenylene-2,5-dymethoxy-1,4-phenylene-1,2-ethylene] (M3EH-PPV), where the M3EH-PPV can be optionally mixed with other electrically active materials and applied as a solution film on the substrate.

Colombian Application No. CO6470853 relates to a composite comprising at least two components, wherein at least one component is present in the form of nanoparticles, consisting of at least three metals and at least one non-metal whose diameter is less than one micrometer, preferably less than 200 nm. The composite according to the invention is particularly well suited for the production of photoactive layers.

Document U.S. Pat. No. 8,329,505 discloses a method for the placement of the cathode structure of an OLED diode. The invention comprises a number of potential advantages such as lower device manufacturing time, less material consumption and less equipment.

Patent document EP1929533 relates to a method of manufacturing an OLED display having a plurality of OLED devices. The method includes providing a plurality of OLED devices on a substrate and sharing a common light transmitting electrode, thus forming a conductive layer structure patterned over the common light emitting electrode.

Korean Patent No.KR100873517 refers to an OLED-PhC device and its manufacturing method. The patent discloses a device and a method that improves the quantum efficiency of the OLED by means of a PhC layer. However, the PhC type is not specified. It could be a 2D-PhC by lithography or colloidal crystal. Nor is the polymer used specified. The present invention proposes a method of manufacturing the active region from a single layer consisting of a colloidal crystal ($SiO_2$ spheres 250 nm in diameter with fcc structure) and the luminescent polymer (MDMO-PPV).

Japanese Patent No. JP4533041 proposes improving the quantum efficiency of an OLED by a chemical treatment on the substrate to make it porous, without specifying the pore size or type of substrate.

Korean Patent Application No. KR20030026450 discloses an organic light emitting device that improves quantum efficiency in an OLED by adding a PhC stratum in the upper layer of the device (concave-convex structure). This document, however, does not specify what type of PhC is used.

Patent No. CN 101000949 proposes a method for improving the mono-chromaticity of OLEDs using a colloidal crystal layer. In the method, a layer of (unspecified) luminescent polymer is deposited on a layer of $SiO_2$ spheres without specifying the method by which this layer is deposited. The present invention proposes synthesizing these two layers in a single procedure using a deposition by centrifugation (spin-coating) type method.

Chinese Patent No. CN101409331 relates to an electroluminescent device that improves light extraction by placing a photonic crystal (not specified) on top of the structure. The improved display device can be manufactured using a thermal transfer donor film layer for adhering the photonic crystal to the structure.

Patent application No. US20080284320 proposes a method for improving the quantum efficiency of OLEDs by using a substrate with a photonic crystal, said crystal comprising a film structure on a substrate produced using a combination of materials with high and low refractive indexes.

Patent document No. US2010148158 refers to improving the quantum efficiency of OLEDs having excellent solubility and thermal stability by incorporating a layer of $SiO_2$ in nanopowder by drip coating.

Similarly, various research papers work on optimizing electroluminescent devices. For example Wang B. et al. deals with improving the quantum efficiency of OLEDs using nanosphere lithography (Journal of Crystal Growth, Volume 288, Issue 1, 2 February 2006, Pages 119-122). Likewise, Kim M. et al., in their article entitled Enhanced performance of organic light-emitting diodes using two-dimensional zinc sulfide photonic crystals, refer to improving the quantum efficiency of OLEDs by ZnS PhC grown on the glass substrate (Journal of Applied Physics, Volume: 106, Issue: 11).

Puzzo D. et al. reports a process for improving the quantum efficiency of OLEDs using 1D-PhC of antimony doped TIN (Nano Lett., 2011, 11 (4), pgs. 1457-1462). Likewise, Quang-Cherng H. relates to the manufacture of a photonic crystal structure using nano-printing, which substantially improves the quantum efficiency of PMMA-OLED using 2D-PhC by lithography (Microelectronic Engineering, Volume 91, March 2012, Pages 178-184).

As can be seen, even though incorporating photonic crystals into the OLED structure has proven a viable option for solving the problem of resorption, specific characteristics are still unclear in terms of size, material, and structure of the crystal, or in which part of the structure they should be placed for optimum efficiency of the electroluminescent structure.

DESCRIPTION OF THE INVENTION

To solve the above problems, and under the fundamental assumption that the efficiency of the combined OLED-colloidal crystal device increases when there is an optical coupling between the absorption of the luminescent polymer and the absorbance of colloidal crystal (by the Bragg condition), this invention describes the manufacturing process for a colloidal crystal with fcc structure comprising silica spheres 250 nm in diameter infiltrated by the luminescent polymer MDMO-PPV by a centrifugation deposition technique (spin-coating), to then be implemented within the typical structure of an OLED (FIG. 1) in order to improve the quantum efficiency of the device. Thus, the object of the present invention is a fast, simple and reproducible manufacturing method, using the technique of deposition by centrifugation (spin-coating) to obtain a thin film formed by a colloidal crystal infiltrated with MDMO-PPV.

The OLED device configuration comprises a sequence of organic layers located between two electrodes, an anode for hole injection and a cathode for electron injection. The charge carriers move through the transport layers and are in the emission layer (EML) where excitons form that have a certain probability of decaying radiatively.

To achieve greater efficiencies, the hole injection layer (HIL) has to facilitate hole injection from the anode layer to the hole transport layer (HTL). This can be achieved by choosing the energy level of the highest occupied molecular orbital (HOMO) so that it is between the HOMO and the HTL and the ionization potential of the anode. The transmission of all the organic layers must be high in the length region of the emission wave. The positions of the HOMO and LUMO (Low Unoccupied Molecular Orbital) orbitals of the emission layer (EML) should enable injection of holes and electrons from neighboring layers. The properties of the electron transport layer (ETL) and electron injection layer (EIL) would be complementary to the already seen HIL and HTL layers. The anode has a high ionization potential to inject holes in the HOMO of the HIL. Therefore, the cathode must be a metal with a low work function. Finally, at least one electrode must be transparent to achieve high efficiency in light extraction. For this reason, in most cases ITO (indium tin oxide) is used as a transparent anode.

The OLED device has fewer layers than those mentiones, as some organic materials meet several of the properties mentioned above in a layer. In the simplest case, as in some polymer-based OLEDs, a single layer must fulfill all the tasks required. This can only lead to high quantum efficiencies if this single layer is capable of injecting and transporting holes and electrons with the same ease.

The barriers to carrier injection in the different interfaces and the mobilities determine the position of the recombination zone and the device's performance, affecting operating voltages and efficiency of luminescence. The interaction between the electrode and the organic layer also has a substantial influence on the electronic properties of the interface, which in turn determine the properties of the OLED. To optimize performance, barriers for charge injection are minimized, choosing electrodes with work functions that adjust well to the polymer's bands.

Therefore, the materials used in the present invention are ITO and PEDOT:PSS for the anode, which have the property of being transparent, allowing light to exit the device.

For the cathode, the material used is a metal with an improved electron injection such as aluminum or silver. However, these materials are reactive with oxygen, so the device must be hermetically sealed to prolong their life. It is possible to achieve an improved electron injection from these metals, by coating the electrode with a single self-assembled polar layer.

Within the framework of the design and manufacturing techniques of optoelectronic devices, luminescent polymers have distinct advantages over traditional inorganic semiconductors, mainly due to a high degree of solubility. This property allows the use of so-called wet manufacturing techniques whose main feature is that they do not require high vacuum systems, which makes them cheaper and more versatile manufacturing techniques for optoelectronic devices.

One of the most widely used wet techniques is deposition by centrifugation (spin-coating) in which a thin uniform luminescent polymer layer is deposited on a substrate, generally a soda-lime glass, by deposition by centrifugation of a polymer-ethanol solution. In addition, the luminescence of these polymers makes them very attractive for designing organic light emitting diodes (OLEDs). Thus the luminescent polymer Poly[p-phenylene-venylene] (PPV) and its conjugated compounds, have historically been the most widely used in the manufacture of this type of lighting devices.

Relevant aspects and advantages of the present invention will be better understood in relation to the following figures.

DETAILED DESCRIPTION OF THE INVENTION

The structure of an OLED device has a layered configuration, and its manufacturing process is sequential. The ITO anode is a transparent support made of glass or a flexible polymer, on which a mixture of indium and tin oxides is deposited, forming a conductive layer. Then, the organic film or films are sequentially deposited. The manner of depositing these layers depends on the nature of the chemicals themselves, which may be polymers or small molecules. Finally, once all the films have been deposited, the device is closed with the cathode, which consists of a low work function metal or metal alloy (aluminum, silver or gold), and is deposited by evaporation techniques under high vacuum.

Figure 1:
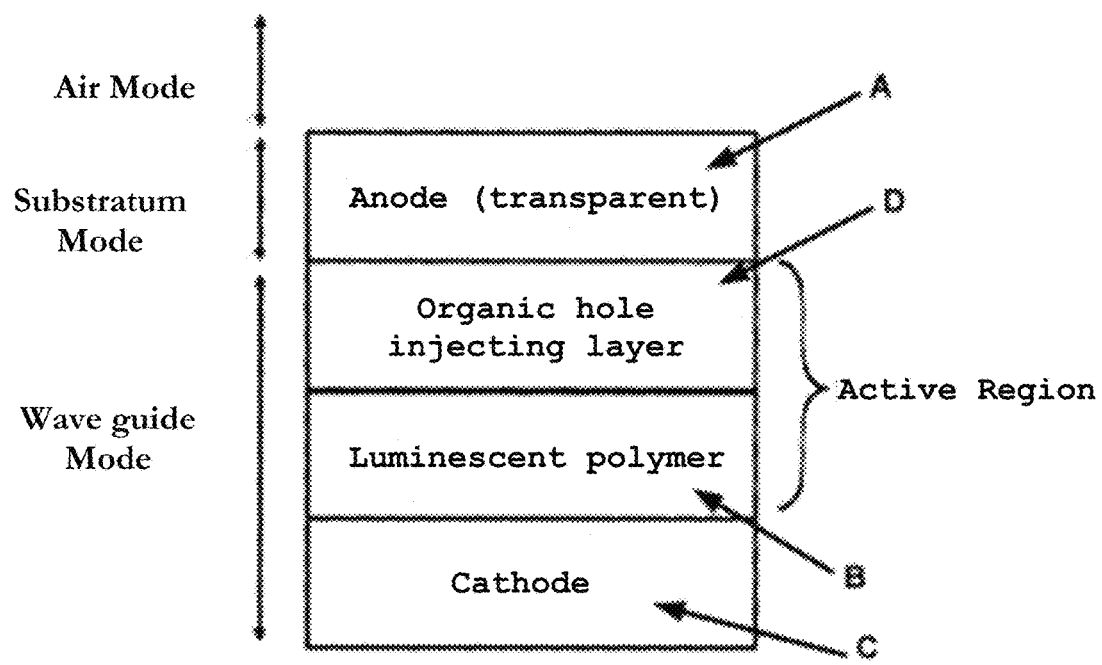
FIG. 1 Schematic diagram of a typical OLED. The optical modes of the device are shown.
Figure 2:
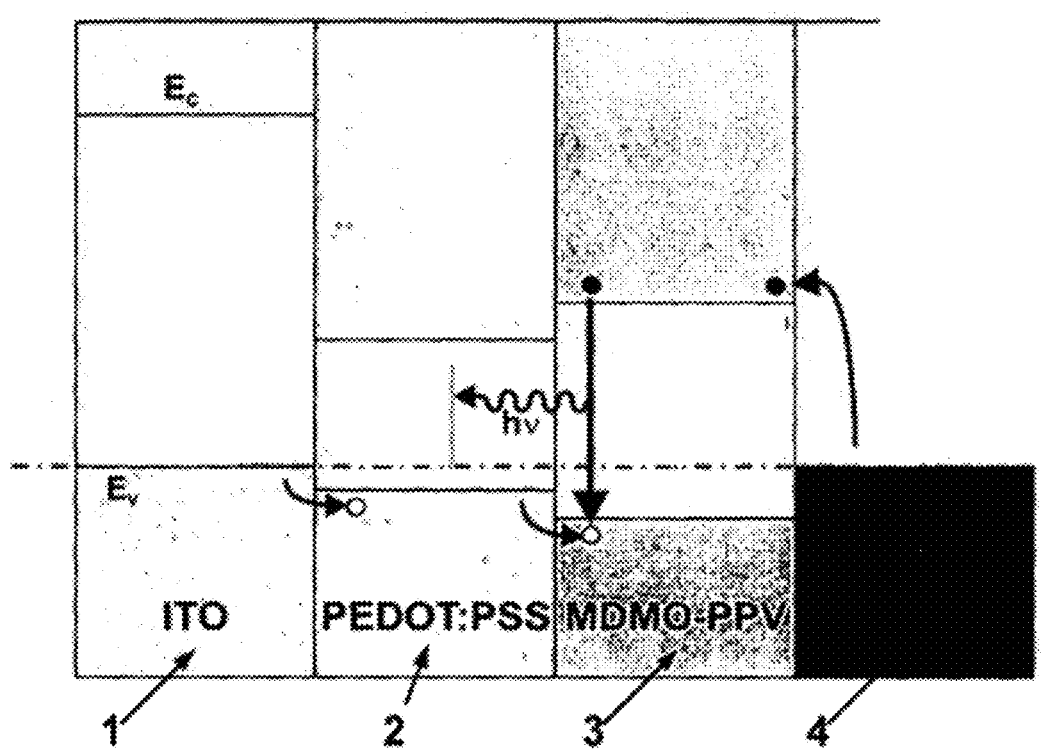
FIG. 2. Schematic diagram of an OLED manufactured from electroluminescent MDMO-PPV polymer, where the different layers that make up the device are shown.

An OLED device made from an electroluminescent polymer comprises different layers aligned according to the different energy levels of the heterostructure. An OLED manufactured from the MDMO-PPV polymer (PPV-OLED) has the ITO/PEDOT:PSS/MDMO-PPV/Metal structure shown in FIG. 2. A thin layer of tin oxide doped with Indium ITO (1) is used as anode, which is a highly transparent p-type degenerate semiconductor (transmittance greater than 90%) in the visible range that operates within the structure of the OLED as a hole injector contact supplying positive charges to the MDMO-PPV depending the difference between the valence band maximum (VBM) of the ITO and the energy of the highest occupied molecular orbital (HOMO) of the MDMO-PPV organic layer. Electroluminescence is produced by the MDMO-PPV organic layer (3) due to the radiative recombination of electron-hole pairs. In order to increase the probability of hole injection to the MDMO-PPV layer (3), an organic conductive and transparent layer PEDOT:PSS (2) is introduced that facilitates the transport of holes from the ITO (1) to the luminescent polymer, because it has an intermediate level of energy between the ITO valence band and the polymer's HOMO. Hence, the PEDOT:PSS is described as a hole transport layer (HTL). As cathode (4), different metals may be used that inject electrons to the electroluminescent layer that recombine radiatively with holes injected from the ITO (anode). The efficiency of the electron injection is strongly influenced by the work function of the metal used as a cathode (1), which is generally aluminum, silver or gold.

Although the electroluminescent characteristics of the MDMO-PPV system depend intrinsically on the constituent materials, which determine the alignment of their energy levels, the hole density, and the efficiency of electron injection from the cathode, it is clear that the efficiency of the device is affected by geometrical factors and manufacturing parameters such as the thickness of the MDMO-PPV layers (3), PEDOS:PSS (2) and ITO (1) and, above all, the quality of their interfaces. Thus, there have been recent intensive studies on ways to significantly increase the intensity of radiation extracted from the OLED, such as: i) the incorporation of scattering centers in the structure, ii) use of microlenses, iii) incorporation of materials with low refractive index, iv) use of Bragg refractors, v) incorporation of nanoparticles into the structure, and vi) patterning of the substrate.

In particular, the incorporation of scattering centers in the structure is one of the most efficient methods to enhance OLED light extraction for general lighting applications. If a compact hexagonal monolayer (hcp) of $SiO_2$ colloidal spheres is incorporated in the region of the waveguide mode, the device efficiency increases significantly because the ordered structure behaves as a two-dimensional diffraction grating. Bi-dimensional PhCs have been used extensively to increase OLED light extraction, forming structures known as ITO/Organic/PhC. Moreover, patterning the ITO surface by photolithography in the form of a two-dimensional square lattice with periodicity of 300 nm has shown that, when the Bragg condition is satisfied, the radiation emitted in the active region is coupled to the air mode radiation.

Figure 3:
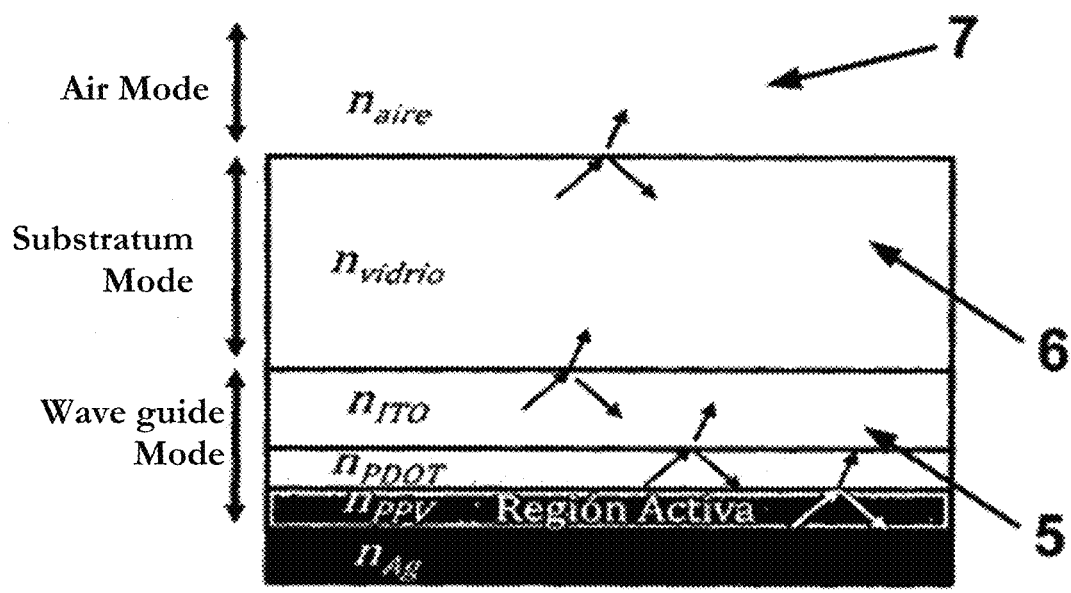
FIG. 3. Schematic diagram of the structure of layers in an MDMO-PPV OLED.

In general, the radiation emitted by the active MDMO-PPV region can be classified into three main modes, shown in FIG. 3. The waveguide mode (5), wherein the radiation is trapped in the region formed by the ETL/MDMO-PPV/PEDOT:PSS/ITO layers due to total internal reflection phenomena, mainly in the ITO/substrate and ETL/MDMO-PPV interfaces. The substrate mode (6), when radiation is trapped within the substrate, due to the ITO/substrate and substrate/air interfaces. The air mode (7), when the radiation emitted by the active region exits the device into the air. The radiation produced in the active region undergoes various reflection-refraction processes, depending on the refractive indices at the interfaces between the different layers of the structure. This is represented in the figure by the arrows at the interfaces.

From the viewpoint of classical optics, due to refraction-reflection processes between the different layers constituting the PPV-OLED, the extraction efficiency of light from the device is only 20%, considering that the extraction efficiency of OLED light is defined as the ratio of the intensity of radiation in the air mode and the intensity of the total radiation emitted by the active element of the device.

To increase the efficiency of the combined OLED-colloidal crystal, the coupling between the absorption of the luminescent polymer and the absorbance of the colloidal crystal must be ensured by the Bragg condition. Accordingly, the present invention develops a method of manufacturing, by deposition by centrifugation technique (spin-coating), a colloidal crystal formed by silica spheres of about 250 nm in diameter with face-centered cubic structure (fcc) and infiltrated with the luminescent polymer MDMO-PPV for use in increasing the OLED light extraction.

The manufacturing process of a thin film formed by a colloidal crystal infiltrated with the luminescent polymer MDMO-PPV formed from silica spheres ($SiO_2$) with face-centered cubic structure (fcc) includes the following steps:

1. Synthesis of mono-dispersed $SiO_2$ spheres
   i) Synthesis of $SiO_2$ spheres of 250 nm diameter by the method Stober (Stober, W., Fink, A., Bohn, E. Controlled growth of monodisperse silica spheres in the micron size range, J. Colloid Interface Sci. 1968: 26 (1): 62-69). This method is suitable for synthesizing spheres between 100 and 2000 nm, depending on the reaction time and the relative concentration between water, ammonia, ethanol and tetraethyl orthosilicate ($Si(OC_2H_5)_4$), abbreviated TEOS. The reaction is allowed for time required, in the order of about one hour, depending on the diameter needed for the $SiO_2$ spheres.
   ii) A mixture of water and $SiO_2$ spheres obtained from the previous step is sedimented at least three times in order to obtain a solution of mono-dispersed $SiO_2$ spheres.
   iii) Finally, the suspension is dried by speed centrifugation for the time necessary for the spheres to be separated from the solvent. To obtain $SiO_2$ spheres powder, the dried suspension is heated to the temperature and time necessary for the solvent to evaporate.

2. Preparation of the colloidal suspension
   i) Preparation of a viscous suspension of $SiO_2$ spheres of required diameter and a suitable organic solvent at concentrations appropriate for obtaining a suspension with a sufficient amount of $SiO_2$ spheres to cover the entire area of the substrate. The condition is that the organic solvent be sufficiently viscous (viscosity-2.0 mPa·s) and that the luminescent polymer be soluble therein.
   ii) In order to remove possible agglomerates caused by drying of the $SiO_2$ spheres, the suspension is subjected to ultrasound during the time required, in the order of half an hour, to ensure that said agglomerates are destroyed and in this way a uniform suspension is obtained.
   iii) The luminescent polymer is added to the suspension obtained in the previous step so that a mixture is obtained, with suitable viscosity and density values for the luminescent polymer, the organic solvent and the $SiO_2$ spheres.
   iv) In order to obtain a uniform mixture, it is subjected to magnetic stirring for the time and temperature necessary for the luminescent polymer to dissolve uniformly in the suspension.

3. Chemical treatment of the substrate
   i) In order for the substrate to have hydrophilic properties, a substrate of soda lime is introduced in chromic solution (mixture of potassium dichromate, sulfuric acid and water in suitable proportions) for the time necessary to obtain this effect. The substrate is removed from the chromic solution and washed multiple times with deionized water, and dried under stream of an inert gas (argon or nitrogen).

4. Synthesis of the thin film
  i) A volume of the mixture required to cover the total area of the substrate is deposited onto the previously hydrophilized substrate and processed by the the deposition by centrifugation method (spin-coating) at an appropriate rate and time, to obtain a uniform film in wherein formation of a colloidal crystal infiltrated by a luminescent polymer is observed.
5. Characterization of the thin films obtained The thin films obtained are characterized structurally by the electron microscope scanning technique (JEOL JSM 6490) and, optically, by UV-VIS absorbance at a determined angle (Ocean Optics QE65000 Scientific-grade Spectrometer) and photoluminescence (Acton Research 270 Monochromator, Hamamatsu photomultiplier tube, Standford Research Systems SR830 Amplifier lock-in).

One of the main features of the method developed is that the preparation of the $SiO_2$ spheres colloidal solution requires a high viscosity organic solvent that also enables the polymer's dissolution. Therefore, the solvent is selected from the family of organic compounds such as cyclohexanone. Similarly, the present method includes the step of introducing a quantity of organic polymer in the colloidal solution, to obtain an $SiO_2$ colloidal crystal infiltrated with a luminescent polymer. The effect achieved by these features is that by using a high viscosity solvent, a combined preparation of colloidal solution is obtained. Similarly, the efficiency of the combined OLED-colloidal crystal device increases when there is a coupling between the luminescent polymer and absorbing the absorbance of the colloidal crystal.

Figure 4:
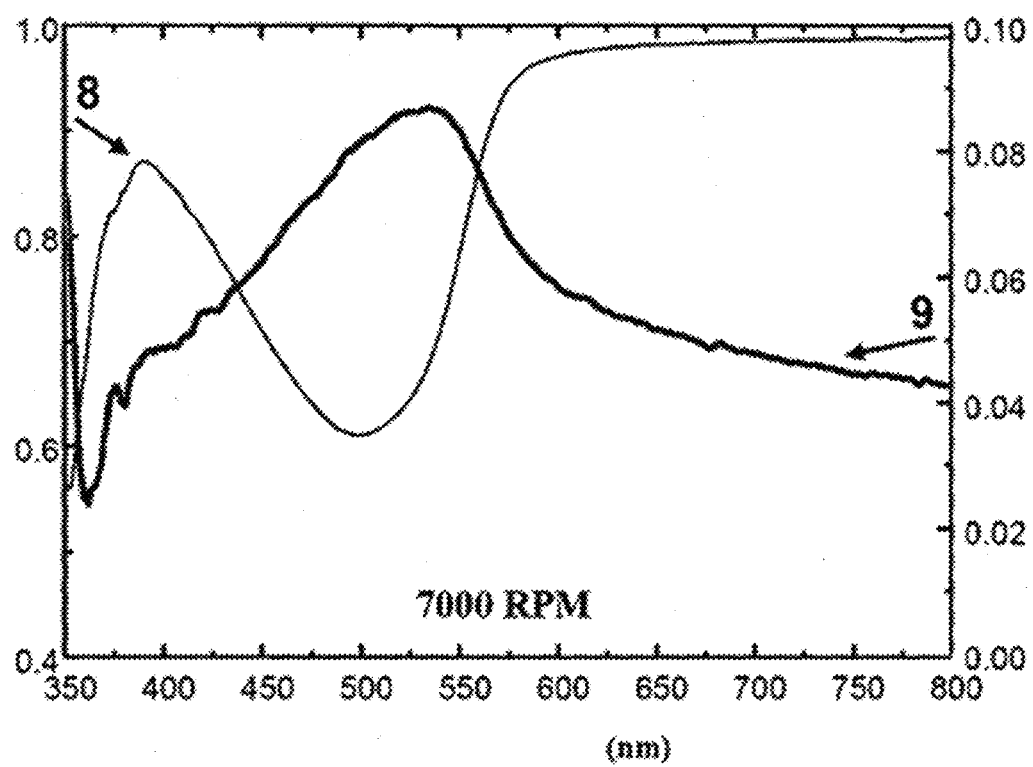
FIG. 4. Transmittance and reflectance spectra of an MDMO-PPV layer.

Since the basic hypothesis of the invention is the optical coupling between the absorption of the MDMO-PPV and the absorption of the colloidal crystal, which depends on the size of the spheres, the packing symmetry (fcc), and the refractive index of the MDMO-PPV and the $SiO_2$ spheres (which depends, in turn, on the size of the spheres), according to the relationship (Bragg diffraction)

$$\lambda = 2h\sqrt{n_{\text{eff}}^2 - \sin\varphi}$$

with $$n_{\text{eff}} = \sqrt{fn_{SiO_2} + (1-f)n_{MDMO\text{-}PPV}}$$

Where $h = \pi\sqrt{(1/3)}$ is the packing factor (for compact fcc packing), $f = d(\sqrt{(2/3)})$, d is the diameter of the spheres, $n_{SiO2} = 1.43$ and $n_{MDMO\text{-}PPV} = 1.8$. FIG. 4 shows the transmittance (8) and reflectance (9) spectra of an MDMO-PPV layer obtained by deposition by centrifugation (spin coating) at 7000 rpm from a mixture of Cyclohexanone and MDMO-PPV at 1% w/w, it can be seen that, at normal incidence ($\varphi = 0$), $\lambda = 500$ nm, whereby the diameter of the spheres must be about 250 nm.

Figure 5:
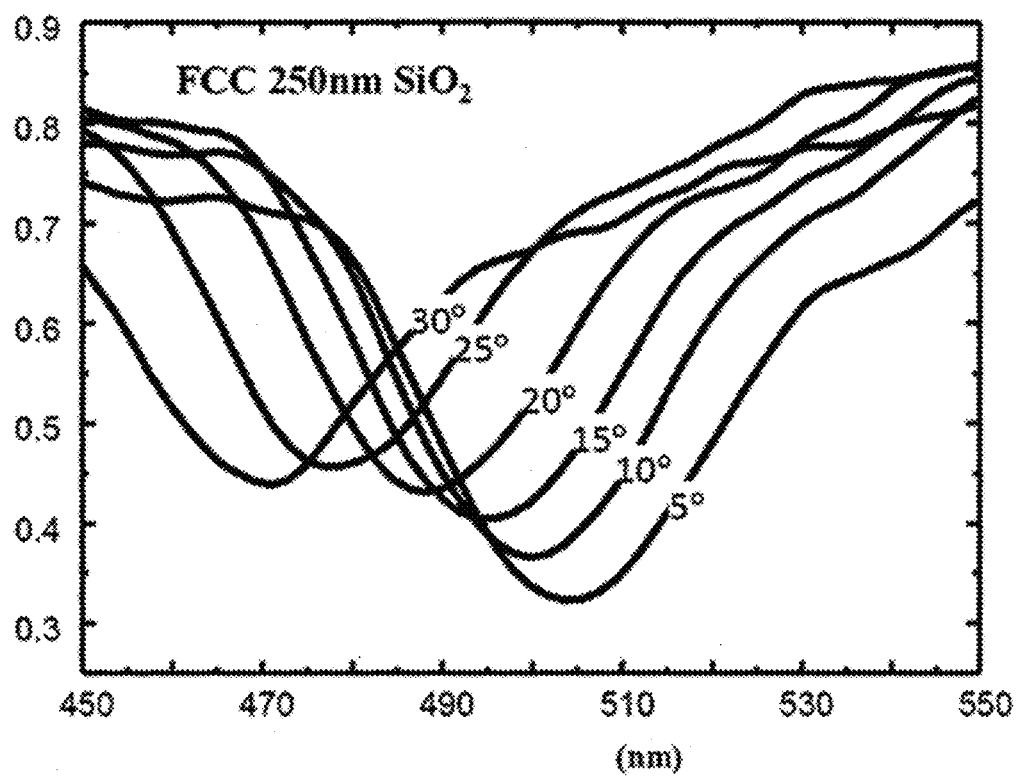
FIG. 5. Transmittance spectrum as a function of the angle of incidence of a colloidal crystal with FCC structure.

This calculation is verified by the transmission spectrum, depending on the angle, as seen in FIG. 5 where the transmittance spectrum is shown according to the angle of incidence of a colloidal crystal formed by $SiO_2$ spheres of 250 nm in diameter with compact fcc packing.

Figure 6:
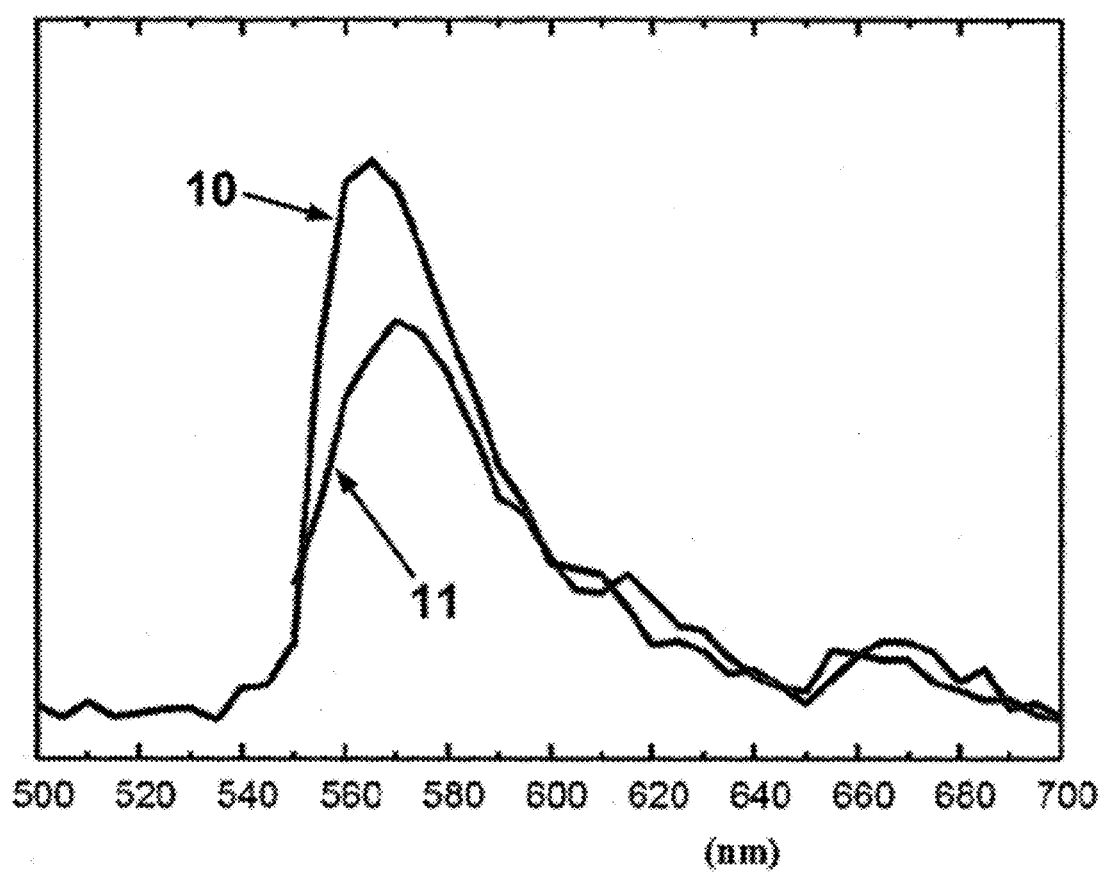
FIG. 6. Photoluminescence spectrum of an MDMO-PPV layer obtained by deposition by centrifugation (spin-coating).

The photoluminescence spectrum of the MDMO-PPV is shown in FIG. 6, in which it is evident that the MDMO-PPV emission wavelength, dissolved in cyclohexanone at 1% w/w, is approximately 565 nm (10). Another emission peak of lower intensity appears at 665 nm (11).

Figure 7:
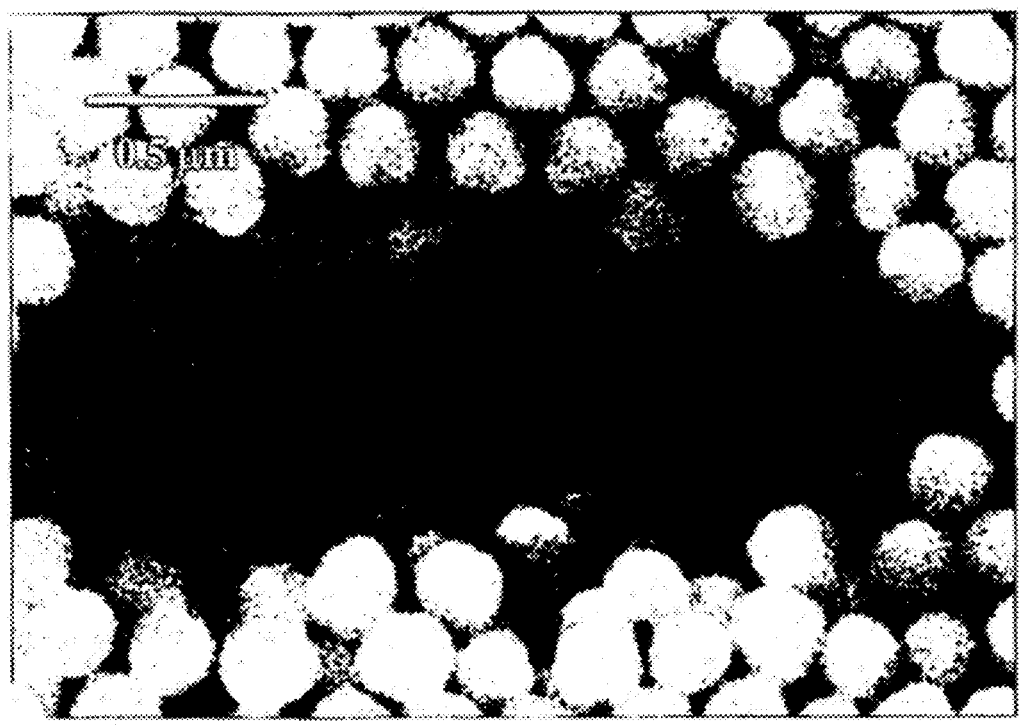
FIG. 7. SEM image of a colloidal crystal obtained from a 15:85 w/w solution of $SiO_2$ spheres 250 nm in diameter and 1% w/w cyclohexanone.
Figure 8:
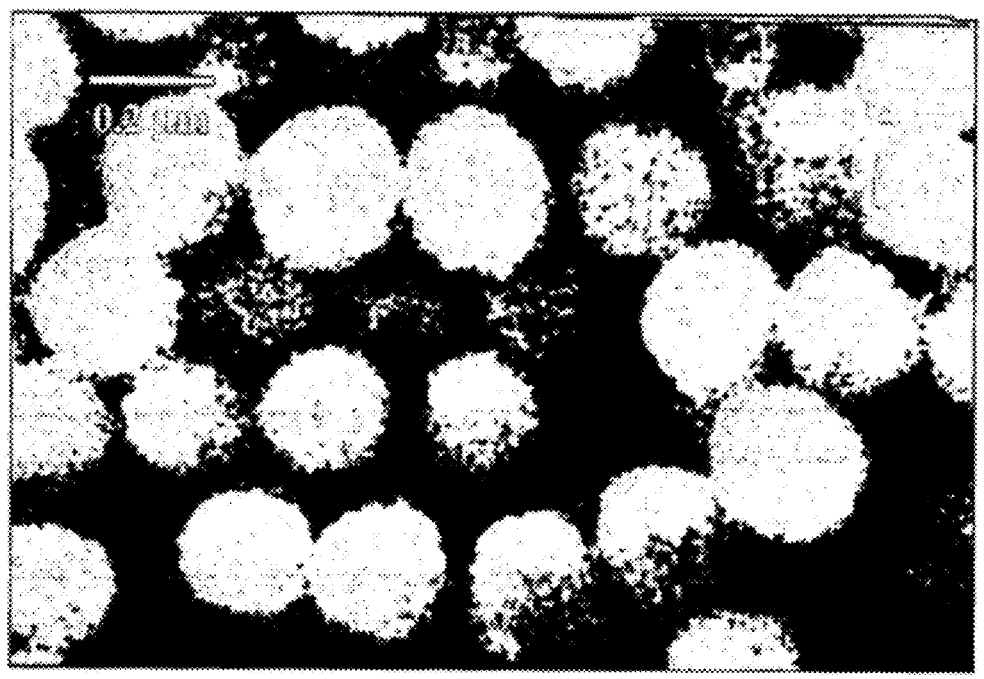
FIG. 8. SEM image of a colloidal crystal obtained from a 17:83 w/w solution of $SiO_2$ spheres 250 nm in diameter and 1% w/w cyclohexanone.

The SEM structural study of the films obtained is shown in FIG. 7. Clearly, there is a tendency to obtain films with compact fcc packing in which the film surface defines a plane (111) of the cubic structure. The thickness of the film is also seen in the figure. Depending on the speed of the spin-coating process and the $SiO_2$ concentration, the thickness of the film can be modified. At 8400 RPM a film of at least 5 monolayers (1.2 μm) is obtained. For uniform coating suitable $SiO_2$ concentrations should be used (typically >15% w/w), otherwise the film will not be uniformly covered as shown in FIG. 8.

Figure 9:
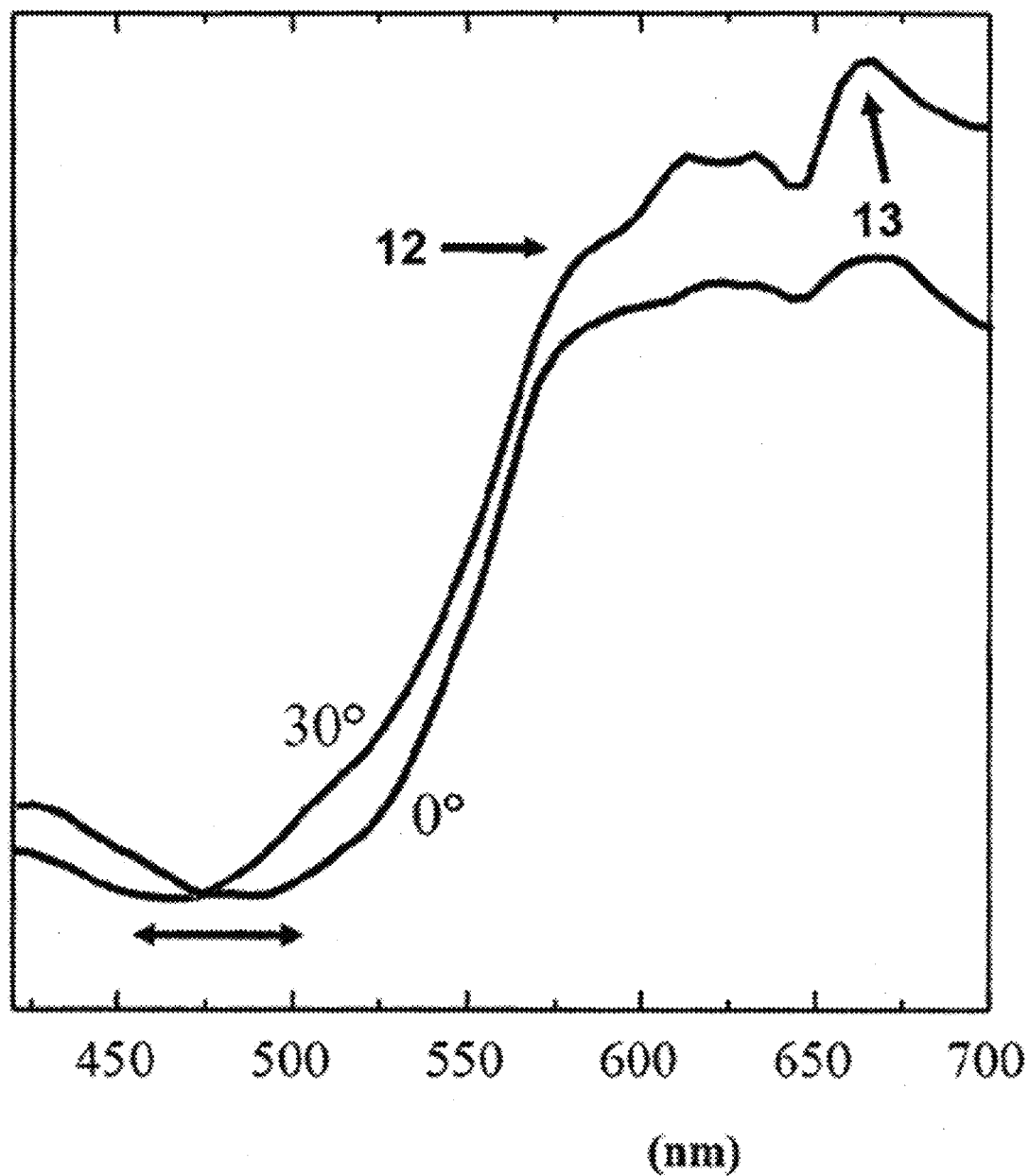
FIG. 9. Transmittance spectrum of a colloidal crystal formed by $SiO_2$ spheres of 250 nm in diameter and infiltrated with MDMO-PPV.

The optical study of thin films obtained shows the optical coupling of the MDMO-PPV with the colloidal film as seen in FIG. 9. The absorption and luminescence peaks are observed simultaneously in the transmission spectrum of the $SiO_2$ colloidal film infiltrated with MDMO-PPV (12 and 13 in FIG. 9). A normal incidence, as shown in FIGS. 4 and 5, the absorptions of the MDMO-PPV and the colloidal crystal are at 500 nm, approximately. FIG. 9 clearly shows the superposition of the absorption of both systems. At an angle of incidence of 30°, according to FIG. 5, there is a shift of the colloidal crystal absorption at 470 nm, whereas the MDMO-PPV absorption remains unchanged and, therefore, the superposition of the two absorbance peaks is observed.

This shows that indeed in the MDMO-PPV/colloidal crystal system the absorbance is the overlap of the absorbance of each of the systems, while the colloidal film is "transparent" to the MDMO-PPV's luminescence. For this reason, the luminescence can be detected even in the transmittance spectra.

It is not considered necessary to extend this description for an expert in the art to understand the scope and advantages of the invention. All technical and scientific terms used herein have the same meaning as commonly understood by those skilled in the art.

The invention claimed is:

1. A method for manufacturing a thin film formed by a colloidal crystal infiltrated with the luminescent polymer MDMO-PPV formed from silica spheres ($SiO_2$) with face-centered cubic structure (fcc), characterized by the following steps:
   a) Synthesize mono-dispersed $SiO_2$ spheres;
   b) Prepare a viscous suspension of $SiO_2$ spheres between 200 and 450 nm in diameter, depending on the refractive index of the luminescent polymer used, and an organic solvent in which the luminescent polymer is soluble and also having high viscosity (>2.0 MPa·ps) at a concentration between 80 and 90% w/w to obtain a suspension with a suitable amount of $SiO_2$ spheres to cover the entire area of the substrate;
   c) Subject the suspension to an ultrasonic cleaner (50-300 kHz) to remove possible agglomerates of spheres;
   d) Add the luminescent polymer to the suspension obtained in the previous step so that a mixture is obtained between 1 and 2% w/w viscosity and density, between the luminescent polymer, the organic solvent and $SiO_2$ spheres;
   e) Subject the mixture to magnetic stirring for a time between 0.5 and one hour at room temperature to dissolve the luminescent polymer uniformly in the suspension;
   f) Introduce a soda lime substrate in chromic solution for one hour so the substrate acquires hydrophilic properties;
   g) Remove the substrate from chromic solution and rinse three times with deionized water, then dry under the flow of an inert gas;
   h) In order to obtain a uniform film in which the formation of a colloidal crystal infiltrated with a luminescent polymer is observed, deposit 200 μl of mixture over the previously hydrophilized substrate and process by the spin-coating method at speeds of 5000 to 8000 RPM for a time of between 1 and 2 minutes.

2. A method for manufacturing a thin film formed by a colloidal crystal infiltrated with the luminescent polymer MDMO-PPV according to claim 1, wherein the step of synthesizing monodisperse $SiO_2$ spheres is performed by the StOber method, consisting of sedimenting, at least three times, a mixture of deionized water and the $SiO_2$ spheres obtained above in order to obtain a mono-dispersed solution of $SiO_2$ spheres. Dry the suspension by centrifugation at speeds between 4,000 and 6,000 RPM for 5 minutes to separate the spheres from solvent. Heat the $SiO_2$ spheres powder to remove the solvent by evaporation.

3. A method for manufacturing a thin film formed by a colloidal crystal infiltrated with the luminescent polymer MDMO-PPV according to claim 1, wherein the organic solvent is cyclohexanone with a viscosity of 2.02 mPa·s.

4. A method for manufacturing a thin film formed by a colloidal crystal infiltrated with the luminescent polymer MDMO-PPV according to claim 1, wherein in the step of preparing the colloidal suspension between 600 and 800 µl of suspension are prepared, and between 100 and 155 mg of $SiO_2$ are mixed with a volume of between 650 and 788 µl of cyclohexanone.

5. A method for manufacturing a thin film formed by a colloidal crystal infiltrated with the luminescent polymer MDMO-PPV according to claim 1, wherein in the step of adding the luminescent polymer MDMO-PPV between 5.0 and 8.0 mg of polymer are added to the suspension described.

6. A method for manufacturing a thin film formed by a colloidal crystal infiltrated with the luminescent polymer MDMO-PPV according to claim 1, wherein the chromic solution comprises potassium dichromate, sulfuric acid and water.

7. An OLED device manufactured from the electroluminescent polymer MDMO-PPV according to claim 6, wherein the anode corresponds to a p-type degenerate semiconductor with a transmittance greater than 90% in the range of 335-900 nm.

8. An OLED device manufactured from the electroluminescent polymer MDMO-PPV according to claim 6, wherein the material forming the cathode (1) is silver or aluminum.

9. An OLED device manufactured from the electroluminescent polymer MDMO-PPV according to claim 6, wherein the two-dimensional PhC photonic crystals form ITO/Organic/PhC structures.

10. An OLED device made from the luminescent polymer MDMO-PPV formed from silica spheres ($SiO_2$) with face-centered cubic structure (fcc), comprising an anode formed by a thin layer of tin oxide doped with Indium, ITO (1), an organic MDMO-PPV layer (3) which is introduced into an organic conductive and transparent PEDOT:PSS layer (2), a cathode (4) formed of metallic material and a compact hexagonal monolayer of $SiO_2$ colloidal (PhC) spheres.

* * * * *